United States Patent [19]

Calvin

[11] 4,078,469
[45] Mar. 14, 1978

[54] INSTRUMENT TUNER

[76] Inventor: Noel Morgen Calvin, 2683 Buena Vista Way, Berkeley, Calif. 94708

[21] Appl. No.: 668,626

[22] Filed: Mar. 19, 1976

[51] Int. Cl.$^2$ .................. G04B 1/08; A63J 17/00; G09B 15/02; G01R 23/14

[52] U.S. Cl. .................. 84/454; 84/464; 84/477 R; 324/79 R; 324/79 D

[58] Field of Search ............... 84/1.01, 454, 464, 477, 84/484; 324/79 R, 79 D, 81; 235/92 F

[56] References Cited

U.S. PATENT DOCUMENTS

| | | | |
|---|---|---|---|
| 2,958,250 | 11/1960 | Poehler | 84/454 |
| 3,861,266 | 1/1975 | Whitaker | 84/454 |
| 3,901,120 | 8/1975 | Youngquist | 84/454 |
| 3,982,184 | 9/1976 | Sanderson | 324/79 D |

*Primary Examiner*—E. S. Jackmon
*Attorney, Agent, or Firm*—Herzig & Walsh

[57] ABSTRACT

Display means for electronically generating a visual display of the frequency difference between two frequencies, adaptable for the tuning of musical instruments. In the exemplary body of said adaptation the note from the instrument is picked up through a microphone and fed through electronic means for isolating the fundamental frequency; the frequency and a reference frequency generated by a reference frequency synthesizer are fed into said display means which generates a visual display of the frequency difference between said fundamental frequency and said reference frequency.

6 Claims, 8 Drawing Figures

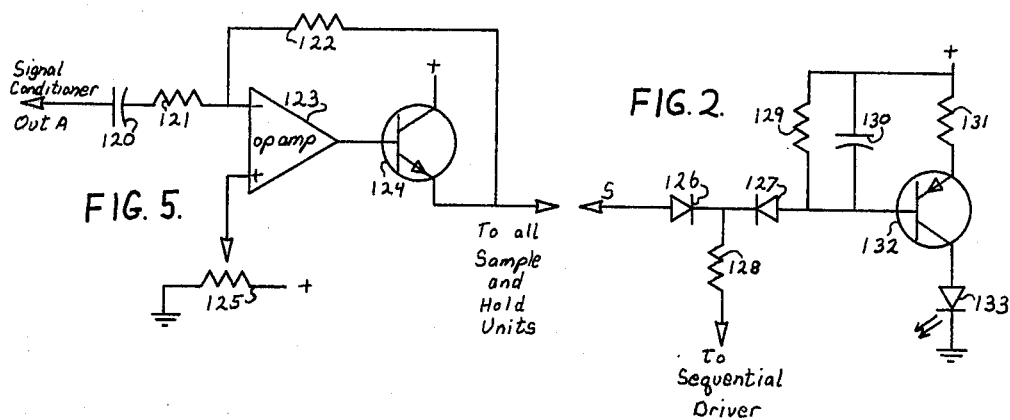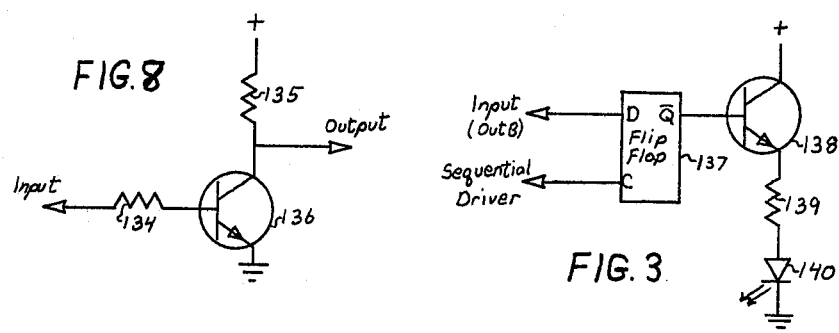

INSTRUMENT TUNER

BACKGROUND AND PRIOR ART

All musical instruments, especially multi-stringed ones such as the piano and harpsichord, require periodic tuning to insure that they consistently reproduce the proper pitches when played.

At present this periodic tuning is accomplished primarily by listening for the beat signal between the note and an audible reference frequency. This is inherently an inaccurate method, and in the case of multi-stringed instruments such as pianos and harpsichords it requires skill far beyond that of the average musician.

There exist today two types of electronic aids which enable the person of no special skill to successfully tune a multi-stringed instrument. In the first of these aids the audible note from the instrument is converted into pulsations of light which are used to illuminate a rotating strobe disc. Deviation of the frequency of the note from the proper value is displayed as apparent movement of a pattern of light and dark spots on the disc.

The second method employs an electronic frequency counter to measure the frequency of the note and provide a digital display of the frequency in hertz. The user must then compare this frequency to the desired frequency and adjust the instrument accordingly.

Both these methods suffer from inherent disadvantages which have prevented their widespread use. The strobe disc method employs an electric motor and is therefore bulky as well as being relatively inaccurate. The frequency counter method has a slow response time, limiting its usefulness to the middle and upper octaves, in addition to which the digital readout is difficult for an untrained person to interpret.

The invention herein described seeks to overcome these disadvantages, thus making it possible for an untrained person to quickly tune any note in the musical spectrum with an accuracy exceeding that of the best professional ear.

SUMMARY AND OBJECTS OF THE INVENTION

The invention relates to a method of generating a visual display of the frequency difference between two frequencies.

The invention makes use of a common optical illusion — the apparent motion of a pattern of light and dark along a string of contiguous light sources, caused by shifting the pattern along the string in steps faster than the eye can follow. In the simplest case, when only one light is on, each shift is accomplished by turning off the light which is on and turning on the neighboring light. If this is done fast enough it looks as if a single spot of light is moving along, rather than like the sequential activation of a number of lights. The illusion of motion is equally vivid for more complex patterns, including those composed of linear gradations in brilliance. If the lights are arranged in a circle the illusion of rotation is created.

The primary function of the invention is to generate a pattern of light and dark on a set of contiguous lights, the apparent motion of which is proportional in speed and direction to the difference between two input frequencies.

In the exemplary body of the invention, which is adapted for the tuning of musical instruments, one of the input frequencies comes from an internal reference frequency generator, and the other from the instrument to be tuned, via a microphone. In use, the instrument is adjusted until all apparent motion of the pattern ceases.

In the exemplary form the invention consists of 16 sample and hold units and associated lights, a sequential driver, a signal conditioner, and a reference frequency generator.

The signal from the microphone, after being amplified and conditioned by the signal conditioner, is fed into the sample inputs of all 16 sample and hold units. Each sample and hold unit is capable of sensing the phase of the input signal during the time when it is driven by a clock pulse, and supplying a current to the associated lamp such that the lamp takes on a brilliance related to the phase of the input signal at the time of the clock pulse.

The sequential driver supplies clock pulses to each of the sample and hold units in turn, in a sequence corresponding to the physical arrangement of the associated lights. The frequency with which the sequential driver activates each sample and hold unit is proportional to the reference frequency. The reference frequency itself is produced by a reference frequency generator, capable of accurately generating a frequency proportional to any note in the musical spectrum.

At any instant the pattern of light and dark on the lights will represent the phase relationship between the reference frequency and the input frequency. If both frequencies are harmonically related the phase relationship between them is fixed, and the pattern on the lights will not change with time — i.e., it will not move. If the frequencies are not quite harmonically related the phase relationship between them will constantly change with a speed proportional to how far from a harmonic relationship the frequencies are. This changing relationship will be reflected in the pattern of light and dark on the lights as apparent movement. The speed of this movement is proportional to rate of change in the phase relationship — i.e., the beat frequency — between the frequencies. The direction of movement is determined by whether the input frequency is slightly higher or slightly lower than the closest subharmonic of the reference — i.e., sharp or flat.

There are two forms of the exemplary embodiment, designated the Digital form and the Analog form, respectively. The principal difference between them is that the Digital form can display the difference frequency between only one input frequency and the reference frequency at a time, while the Analog form can display the difference frequencies between several input frequencies and the reference frequency simultaneously.

The Analog form is particularly useful for tuning instruments such as the piano. In the middle and upper octaves of the piano, when a key is pressed 3 strings are struck. The strings are slightly detuned from one another. If the digital version is used, 2 of the strings must be deadened so that each string may be tuned alone — the same thing a professional piano tuner does. The Analog form will display all three simultaneously, visible as superimposed patterns moving at different speeds and directions.

The Digital form is easier to read than the Analog form, and thus it is preferable for use with instruments — for example the harpsichord or organ — in which each note is composed of only a single fundamental frequency.

In the exemplary body, using the circular display configuration the speed of apparent rotation is equal to one-half the frequency difference between the note and the reference frequency. Thus, if the note is 2 Hz sharp, the display will appear to rotate counterclockwise at 1 revolution per second. Frequency differences as small as 0.02 Hz can easily be detected. Since the human ear can rarely detect errors smaller than 0.5 Hz, the invention succeeds in the primary objective, which is to make it possible for an untrained person to tune any musical instrument with an accuracy exceeding the best professionals.

A further object is to make it possible to tune instruments such as the piano which have more than one wire per note without the necessity of deadening some of the wires.

BRIEF DESCRIPTION OF THE DRAWINGS

FIG. 2 is a circuit diagram of an Analog Sample and Hold unit.

FIG. 3 is a circuit diagram of a Digital Sample and Hold unit.

FIG. 5 is a circuit diagram of the Analog Display Driver.

FIG. 8 is a circuit diagram of a MOS to TTL Level Translator.

DETAILED DESCRIPTION OF THE PREFERRED EMBODIMENT

Figure 1:
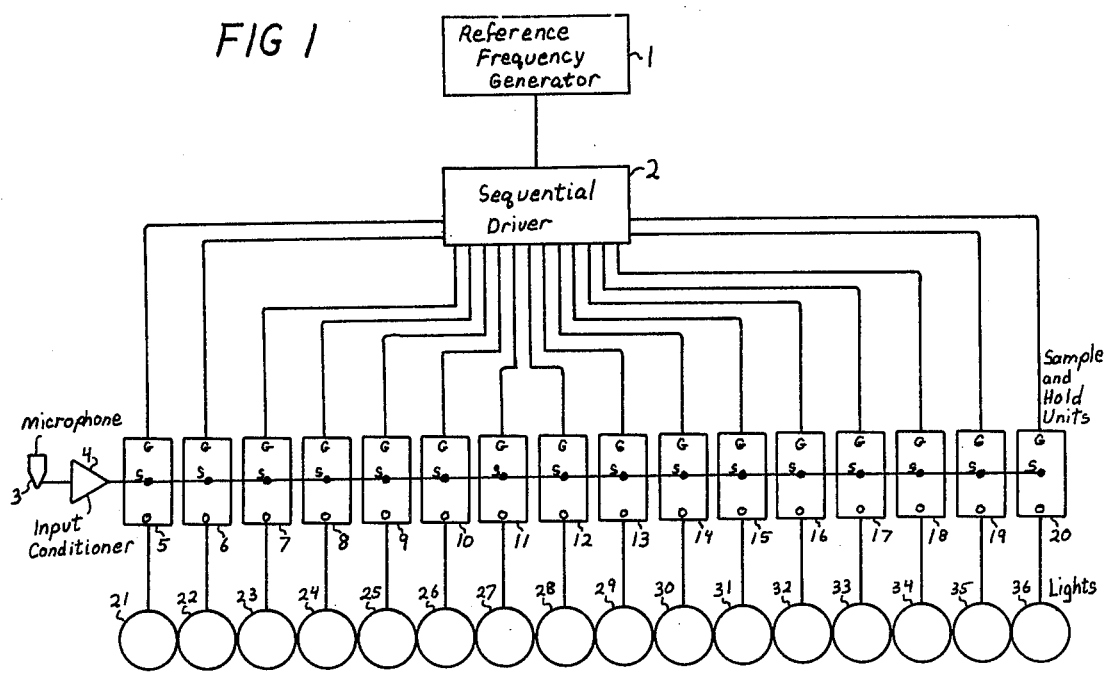
FIG. 1 is a block diagram of the invention.

FIG. 1 is a block diagram of the invention, showing the relationship between the parts as described in the summary. The two forms of the prefered embodiment, analog and digital, differ only in the specific circuitry of the sample and hold units and input conditioner; the reference frequency generator, sequential driver, and overall arrangement as shown in FIG. 1 are common to both.

Referring to FIG. 1, it will be seen that the interconnections among the parts of the invention are as follows: The output of the reference frequency generator 1 is fed into the input of the sequential driver 2. Each of the 16 outputs of the sequential driver is fed into the gate input of one of the sample and hold units 5 through 20. The output of each sample and hold unit is fed into the associated light 21 through 36. The signal inputs of all the sample and hold units are connected to the output of the input conditioner 4. The microphone 3 is connected to the intput of the input conditioner.

The lights are arranged in either a line or a circle, and each one is driven by a separate sample and hold circuit. The sample and hold circuits have three connections: a signal input, a gate input, and an output connected to the lamp. In operation, whatever voltage is present at the signal input is transferred to the output during a pulse at the gate input and maintained there until the next gate pulse. In other words, a "sample" of the input voltage is taken during the gate pulse and transferred to the output, where it is "held" until displaced by the next sample. The brilliance of the lamp is proportional to the level of the sample; thus, a high voltage sample will turn the lamp on, while a low voltage one will turn it off.

There are two forms of the exemplary embodiment, one of which employs digital sample and hold circuits, and the other of which employs analog sample and hold circuits.

The digital sample and hold circuits can store only a logic 1 or 0; no intermediate values. Thus, the display will be composed of lights which are either completely on or completely off. Such a display is very easy to read, providing the input signal conditioner removes all extraneous signals such as voices, etc., and converts the note, whatever its harmonic content, into a square wave. This is accomplished by using a phase locked loop of conventional design, which operates by matching the frequency of an internal square wave oscillator to the fundamental of the largest signal present in the output of the microphone.

The analog sample and hold circuits can store any voltage within their input range, and hence the lamps can take on any brilliance between full off and full on. The contrast ratio of the display — i.e., the ratio of maximum to minimum brilliance — is proportional to the amplitude of the signal present at the sample inputs. To maintain adequate contrast the input conditioner must therefore contain a sensitive automatic gain control which maintains the output near the ideal level regardless of the amplitude of the note from the instrument. This display is somewhat more difficult to read than the digital one, but has the advantage that more than one difference frequency can be displayed at the same time.

The circuit of an analog sample and hold unit is shown in FIG. 2. the remaining 15 units are identical. Diodes 126 and 127, and resistor 128 form a diode transmission gate which charges storage capacitor 130 to the value of the input voltage during a gate pulse. Resistor 129 provides a discharge path for the storage capacitor and determines the persistence of the display. Darlington transistor 132 converts the voltage across the storage capacitor into a current which drives light emitting diode 133. Resistor 131 determines the voltage to current transfer ratio of the circuit.

The circuit of a digital sample and hold unit is shown in FIG. 3. The sampling element is a standard MOS D-type flip flop 137. On the upward transition of the sample pulse, whatever state is present at the signal input at the time is transferred to the output and held there until the next sample pulse. Darlington transistor 138 functions as a lamp driver. Resistor 139 sets the current through light emitting diode 140. The remaining 15 sample and hold units are identical.

The note from the instrument to be tuned is picked up through a microphone. The output of the microphone is fed into the signal conditioner which amplifies it, and removes harmonics as necessary to make a signal suitable for use with the sample and hold circuits. This signal, henceforth referred to as the input signal, is fed simultaneously into the inputs of all 16 sample and hold circuits.

Figure 4:
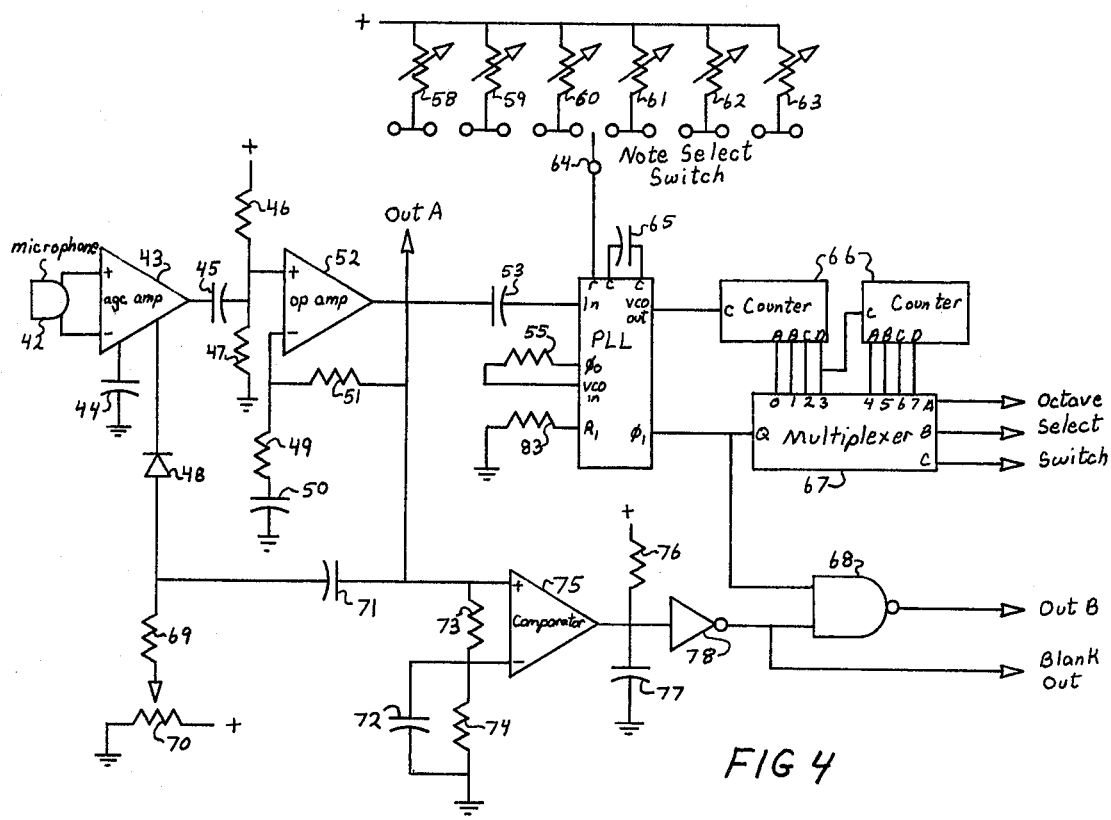
FIG. 4 is a circuit diagram of the Input Conditioner.

The circuit of the input conditioner is shown in FIG. 4. The circuit can be conveniently divided into 3 parts: The automatic gain control stage (agc), which amplifies the output of the microphone to a level of about one-half volts rms, regardless of the volume of the note; the blanking stage, which turns off the display when no signal is present; and the phase locked loop stage, which removes noise and normalizes the harmonic content of the output of the agc stage so that it can be used with the digital sample and hold units.

The agc stage is built around integrated circuit amplifiers 43 and 52. The output of a dynamic microphone 42 is DC coupled into amplifier 43, a special amplifier containing a voltage controlled gain stage designed for agc applications (National Semiconductor Corp. type LM170 or equivalent). The output of this amplifier is coupled through capacitor 45 into the positive input of operational amplifier 52, Fairchild Semiconductor Corp. type 741 or equivalent. Resistors 46 and 47 form a voltage divider setting the bias on the amplifier at one-half the supply voltage. Resistors 49 and 51 provide a negative feedback path around the amplifier and set the AC voltage gain at 40 db. Capacitor 50 sets the DC gain of the amplifier at unity. The output of the amplifier is coupled to the gain control input of agc amplifier 43 through capacitor 71 and diode 48. The level at which the agc engages is set by resistor 69 and potentiometer 70. The agc time constant is set by capacitor 44.

The phase locked loop stage converts the output of the agc stage into a clean square wave of the same frequency, suitable for use with the digital sample and hold units. It is composed of a MOS phase locked loop integrated circuit 54 (RCA type 4046 or equivalent), a standard MOS 8 stage binary divider 66, and a standard MOS 8-line to 1-line multiplexer 67.

The output of the agc stage is AC coupled into the input of the phase locked loop through capacitor 53. Capacitor 65 is the timing capacitor for the voltage controlled oscillator in the phase locked loop. Resistor 83 sets the capture range of the loop, and resistor 55 couples the output of the phase detector to the control input of the voltage controlled oscillator. In order to allow the phase locked loop to be used on all octaves, the loop is broken and a programmable divider formed from 8 stage divider 66 and multiplexer 67 is inserted. The input of the divider is connected to the output of the voltage controlled oscillator. The output of the divider are connected to the multiplexer, which selects one according to the setting of the binary coded decimal octave select switch, and feeds it back into the phase detector input of the phase locked loop. The 3 control inputs of the multiplexer are connected to the octave select switch in parallel with the control inputs of the multiplexer in the reference frequency generator.

To insure rapid acquisition the phase locked loop is pretuned to the approximate frequency of the note in question by trimmer potentiometers 58 through 63, the appropriate trimmer being selected by the second wafer of the note select switch 64.

The output of the phase locked loop stage is taken from the output of the multiplexer, and fed into one input of MOS NAND gate 68, which is part of the blanking system.

The blanking stage is formed around a precision voltage comparator with an open collector output 75 (National Semiconductor Corp. type 311 or equivalent), standard MOS inverter 78, and standard MOS NAND gate 68.

The output of the agc stage is fed directly into the positive input of the comparator. Resistors 73 and 74 form a voltage divider which sets the bias on the negative input approximately 200 mv lower than the positive input. Capacitor 72 decouples the negative input from the AC portion of the input. When no signal is present, the comparator output is high, allowing capacitor 77 to charge through resistor 76. When the voltage across capacitor 77 gets larger than one-half the supply voltage, the output of invertor 78 is driven low, thus driving the output of NAND gate 68 high and blocking the signal from the phase locked loop stage.

When a signal larger than 400 mv peak is present at the output of the agc stage, the output of the comparator goes low during the portion of the input cycle when the signal is more than 200 mv negative with respect to the average value, thus discharging capacitor 77, and forcing the output of the invertor high. This allows the NAND gate to pass the signal from the phase locked loop.

For analog sample and hold units the output of the input conditioner is taken from the agc stage through a buffer, and into the inputs of the sample and hold units, and the phase locked loop section is not used. Blanking is accomplished by feeding the output of invertor 78 in the blanking stage through an inverting MOS to TTL level translator, shown in FIG. 8, into the gate input of the 16 line decoder in the sequential driver 41. When no signal is present the decoder is disabled and no samples are taken.

For digital sample and hold units the output of the input conditioner is taken from the phase locked loop stage, through NAND gate 68, and into the signal inputs of the sample and hold units. Blanking is accomplished when the output of invertor 78 goes low, forcing the output of NAND gate 68 to remain high. This high level corresponds to a "low" sample; all samples taken after the output of the invertor goes low (no signal conditions) will therefore be "low," and the display will be dark.

In order to prevent the analog sample and hold units from loading the output of the agc stage, a buffer circuit, shown in FIG. 5, is used. The buffer is built around a standard operational amplifier 123 (Fairchild Semiconductor Corp. type 741 or equivalent). The output of the agc stage is coupled to the negative input of the amplifier through capacitor 120 and resistor 121. The output of the amplifier is fed into the base of transistor 124, which operates as an emitter follower capable of sourcing about one hundred milli-amperes. The negative feedback loop is closed by resistor 122. The positive input of the amplifier is connected to potentiometer 125, which sets the DC output level, and hence the average brightness of the display.

The sequential driver generates the gate pulses for the samples and hold circuits, one at a time, and in a sequence corresponding to the physical arrangement of the associated lights. It has 16 outputs, one of each sample and hold circuit, and one control input. The control input is connected to the output of the reference frequency synthesizer. The sequential driver switches to a different output upon the completion of each cycle of the reference frequency. Thus, the sample pulses are equal in length to the period of the reference frequency, and the entire sequence of 16 sample pulses is repeated with a frequency 1/16 that of the reference frequency.

Figure 6:
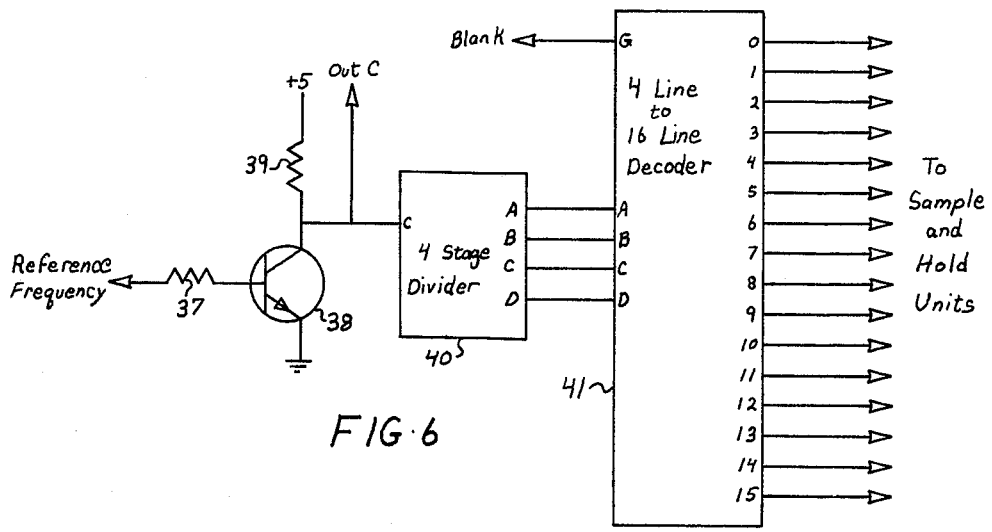
FIG. 6 is a circuit diagram of the Sequential Driver.

The circuit of the sequential driver is shown in FIG. 6. Transistor 38 functions as a MOS or TTL level translator which drives a standard TTL 4-stage binary counter 40. Resistor 32 prevents loading of the reference frequency generator by the transistor, and resistor 39 acts as a pull up resistor for the counter.

The outputs of the counter are fed into the control inputs of a standard TTL 4-line to 16-line decoder 41. As the binary counter counts from 0 to 15 the decoder activates its 16 outputs, one at a time and in sequence. A low level at the gate input of the decoder prevents any of the outputs from being activated.

The reference frequency synthesizer used in both versions can be either of the phase locked loop or direct division variety, both of conventional design. The phase locked loop method offers greater accuracy, while the direct division method is much simpler. In the preferred embodiment the direct division method is used.

Figure 7:
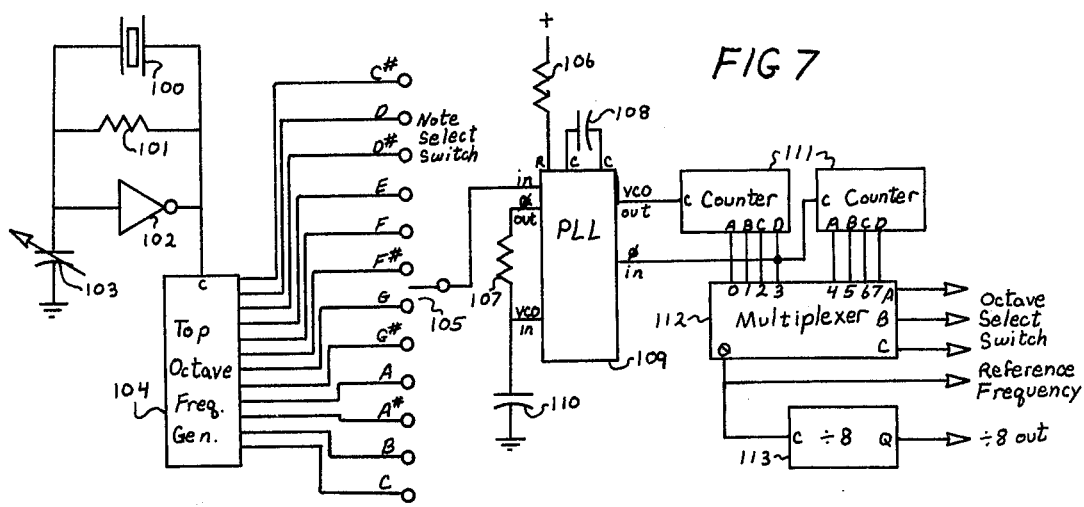
FIG. 7 is a circuit diagram of the Reference Frequency Generator.

The circuit of the reference frequency generator is shown in FIG. 7. The top octave frequency generator 104 is a MOS integrated circuit, Mostek Co. type MK50240 or equivalent, containing 12 independent counters, each of which divides the 2.00024 MHz signal present at the clock input by a different number to generate a particular note in the top octave.

The 2.00024 MHz clock signal is generated by a crystal oscillator built around a standard MOS inverting gate 102 and a 2.00024 MHz crystal 100. Negative feedback is provided through resistor 101 to keep the inverter biased in the linear portion of its transfer curve. Variable capacitor 103 adjusts the load on the crystal and is used for fine tuning the oscillator.

In the preferred form, in which there are 16 lights in the display, a particularly readable display is generated when the reference frequency is exactly 8 times the desired frequency of the note to be tuned. In order to tune notes in the top octave, the output of the top octave frequency generator must be multiplied by 8. Lower octaves are obtained by dividing by successive factors of 2.

The multiplication by 8 and subsequent divisions are accomplished by a phase locked loop 109, in combination with an 8 stage binary divider 111 and an 8 line or 1 line digital multiplexer 112. The phase locked loop is a MOS integrated circuit, RCA type 4046 or equivalent. Both the binary divider and the multiplexer are standard MOS logic components, respectively RCA type 4520 and National Semiconductor Corp. type 74C151 or equivalents.

The note select switch 105 connects one of the outputs of the top octave frequency generator to the input of the phase locked loop. Resistor 106 and capacitor 108 determines the center frequency of loop, and resistor 107 and capacitor 110 determine the loop response characteristics. In order to obtain the times 8 frequency multiplication the loop is opened and a ÷16 counter, formed of the first 4 stages of the binary divider, is inserted. When the loop is in a locked condition, the output of the first stage of the binary divider will thus equal exactly 8 times the input frequency selected by the note select switch. The outputs of successive stages of the binary divider will equal 4, 2, 1, ½, ¼, ⅛, and 1/16 times the input frequency, thus covering all octaves.

The eight outputs of the binary divider are fed into the 8 inputs of the 8 line to 1 line multiplexer, which selects one according to the setting of the binary coded decimal octave select switch 114. The output of the multiplexer is fed into the reference frequency input of the sequential driver 2, and also into the input of a standard MOS divide by 8 counter 113. The output of this counter is equal to the desired frequency of the note to be tuned, and can be fed into an earphone for use as an audible reference.

The system operates as follows:

Consider the case in which the input signal is a square wave of sufficient amplitude to turn the sample and hold lights either completely on or off, and of a frequency one-eighth that of the reference frequency. For every cycle of the input signal the reference frequency will go through 8 cycles; thus, there will be 8 samples taken per cycle of the input signal. Since the input signal is a square wave, 4 of these samples will be high and 4 will be low. The display will therefore consist of 2 groups of 8 lamps, each group being made up of 4 lighted lamps, followed by 4 dark lamps.

If the input frequency is exactly equal to one-eighth the reference frequency, the sampling sequence will start over at precisely the same point in the input signal each time, and the same lights will be on each time. Thus, the pattern will stand still.

If the note is slightly sharp — i.e., the input signal is higher than one-eighth the reference frequency — the sampling sequence will start over at an earlier point in the input signal each time. Different lights will therefore come on each time, and the illusion of movement is created. If the note is flat the direction of movement is reversed.

From the foregoing, those skilled in the art will readily understand the nature of the invention, the manner in which the method is executed, and the manner in which all of the objects set forth are achieved and realized.

The foregoing disclosure is representative of preferred forms of the invention and is to be interpreted in an illustrative rather than a limiting sense, the invention to be accorded the full scope of the claims appended hereto.

I claim:

1. A system for generating a visual display of the frequency difference between a reference signal and a measured signal including a plurality of light sources, a source of reference signal, a means for applying the measured signal to the light sources, said means comprising a plurality of analog sample and hold circuits, one per light, and means responsive to said reference signal for controlling the activation of said sample and hold circuits, said light sources being arranged in a pattern whereby a display is realized wherein the light sources appear to be moving with a direction and speed corresponding to said frequency difference.

2. A system as in Claim 1, wherein said means responsive to said reference signal for controlling activation of said sample and hold circuits is a sequential driver which activates each of said sample and hold circuits separately and in sequence, with a frequency proportional to the frequency of said reference signal.

3. A system as in claim 1, wherein said measured signal is generated from an audible note by a microphone.

4. A system as in claim 3, wherein the output of said microphone is fed through an automatic gain control before being applied to said sample and hold circuits in order to maintain an adequate contrast ratio on the display.

5. A system as in claim 1, wherein provision is made to deactivate the visual display in the absence of a measured signal of sufficient amplitude.

6. A system as in claim 1, wherein said light sources are arranged in a circle, thereby creating the visual illusion of rotation.

* * * * *